United States Patent
Okami

(10) Patent No.: US 10,190,890 B2
(45) Date of Patent: Jan. 29, 2019

(54) CAPACITANCE-TO-VOLTAGE CONVERSION CIRCUIT

(71) Applicant: Murata Manufacturing Co., Ltd., Nagaokakyo-shi, Kyoto-fu (JP)

(72) Inventor: Tsuyoshi Okami, Hamamatsu (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 419 days.

(21) Appl. No.: 15/209,891

(22) Filed: Jul. 14, 2016

(65) Prior Publication Data
US 2016/0320211 A1 Nov. 3, 2016

Related U.S. Application Data

(63) Continuation of application No. PCT/JP2015/051472, filed on Jan. 21, 2015.

(30) Foreign Application Priority Data

Jan. 28, 2014 (JP) .................................. 2014-013312

(51) Int. Cl.
G01D 5/24 (2006.01)
G01P 15/125 (2006.01)
G01R 27/26 (2006.01)

(52) U.S. Cl.
CPC .............. *G01D 5/24* (2013.01); *G01P 15/125* (2013.01); *G01R 27/2605* (2013.01)

(58) Field of Classification Search
CPC ...... G01D 5/24; G01D 5/2417; G01P 15/125; G01R 1/30; G01R 27/2605
(Continued)

(56) References Cited

U.S. PATENT DOCUMENTS 4,363,976 A * 12/1982 Minor .................. G11C 27/026
327/58
5,963,158 A * 10/1999 Yasuda ................ G11C 27/028
327/94
(Continued)

FOREIGN PATENT DOCUMENTS

JP 2004279261 A 10/2004
JP 2006071498 A 3/2006
JP 2012037439 A 2/2012

OTHER PUBLICATIONS

International Search Report issued for PCT/JP2015/051472 dated Mar. 10, 2015.
(Continued)

*Primary Examiner* — Jeff Natalini
*Assistant Examiner* — Steven Yeninas
(74) *Attorney, Agent, or Firm* — Arent Fox LLP

(57) ABSTRACT

A capacitance-to-voltage conversion circuit including a variable capacitance element, an integration circuit, and first and second sample and hold circuits. Capacitance value of the variable capacitance element varies depending on a physical quantity. The integration circuit outputs a voltage as a result of integration. The first sample and hold circuit samples and holds the voltage. The second sample and hold circuit samples and holds the sampled voltage and performs a simultaneous sampling operation in synchronism with the first sample and hold circuit at the same period as at least an initial sampling period. The second sample and hold circuit performs a sampling operation at a rear-end period in a sampling period of the first sample and hold circuit other than the sampling period.

20 Claims, 3 Drawing Sheets

(58) Field of Classification Search
USPC ..... 73/514.32; 324/658, 659, 678, 679, 686; 327/91, 93, 94, 95, 96
See application file for complete search history.

(56) References Cited

U.S. PATENT DOCUMENTS

| | | | | |
|---|---|---|---|---|
| 6,952,966 | B2 | 10/2005 | Itakura | |
| 7,334,474 | B2 * | 2/2008 | Fax | G01P 15/125 |
| | | | | 73/514.18 |
| 7,642,913 | B2 * | 1/2010 | Hayakawa | G01P 15/08 |
| | | | | 324/661 |
| 2004/0183551 | A1 * | 9/2004 | Itakura | G01P 15/125 |
| | | | | 324/663 |
| 2008/0122457 | A1 * | 5/2008 | Taguchi | G01R 27/2605 |
| | | | | 324/679 |
| 2008/0295597 | A1 * | 12/2008 | Stewart | G01P 15/125 |
| | | | | 73/514.18 |

OTHER PUBLICATIONS

Written Opinion of the International Searching Authority issued for PCT/JP2015/051472 dated Mar. 10, 2015.

* cited by examiner

# CAPACITANCE-TO-VOLTAGE CONVERSION CIRCUIT

CROSS REFERENCE TO RELATED APPLICATIONS

The present application is a continuation of PCT/JP2015/051472 filed Jan. 21, 2015, which claims priority to Japanese Patent Application No. 2014-013312, filed Jan. 28, 2014, the entire contents of each of which are incorporated herein by reference.

TECHNICAL FIELD

The present disclosure relates to a capacitance-to-voltage conversion circuit that outputs a voltage corresponding to a variation of the capacitance.

BACKGROUND

An example of a capacitive sensor for detecting physical quantities (angular velocity, acceleration and the like) is a sensor that includes capacitance of a variable capacitance element for detection that varies depending on a physical quantity applied, and converts, with a capacitance-to-voltage conversion circuit, the amount of variation in the capacitance of the variable capacitance element into a voltage value (e.g., JP 2006-71498 A).

A certain capacitance-to-voltage conversion circuit included in the capacitive sensor uses a correlated double sampling to detect the amount of variation in the capacitance. In this type of capacitance-to-voltage conversion circuit, for example, one of input terminals of a differential amplifier is connected to a connecting point of two variable capacitance elements that are supplied alternately with voltages complementary with respect to a reference voltage, and a sample and hold circuit is connected subsequent to the differential amplifier. The capacitance-to-voltage conversion circuit once resets the two variable capacitance elements to the reference voltage, and after resetting, integrates a difference of the capacitances of the two variable capacitance elements as a difference in electric charge with the differential amplifier, to retrieve the result in the form of a voltage signal with the sample and hold circuit.

In the capacitance-to-voltage conversion circuit, it is known that a device noise occurs from various devices such as semiconductor devices and resistive elements that are disposed on the circuit. This device noise can include a white noise that is not dependent on a specific frequency and a 1/f noise whose noise intensity increases in a low-frequency bandwidth. Among those device noises, a device noise contained in the bandwidth of the differential amplifier of the capacitance-to-voltage conversion circuit undergoes a phenomenon (hereinafter, referred to as "noise returns") in which it is processed in superposed manner for not only a device noise with a sample and hold sampling frequency, but also a device noise with a high-order frequency that can be sampled at a frequency (i.e., Nyquist frequency) that is half the sampling frequency, for example.

As a result, with the device noise processed in the superposed manner by the noise returns contained in an output signal of the capacitance-to-voltage conversion circuit, the output signal is outputted to a subsequent circuit (e.g., an analog-to-digital conversion circuit or a buffer amplifier).

In order to solve this, it may be possible to suppress the high-order frequency device noise by limiting the bandwidth in accordance with the sampling frequency. The band limitation can be performed, for example, by connecting a capacitance element for band limitation to an output terminal of the differential amplifier. However, this configuration may undesirably increase the processing time needed for the capacitance-to-voltage conversion and also increase power consumption.

SUMMARY OF THE INVENTION

An object of the present disclosure is to provide a capacitance-to-voltage conversion circuit capable of a noise reduction while reducing the power consumption with maintained processing time for capacitance-to-voltage conversion.

A capacitance-to-voltage conversion circuit according to the present disclosure includes a variable capacitance element of which capacitance value varies depending on a physical quantity applied to the capacitance element, an integration circuit that outputs an output voltage as a result of integration of electric charges supplied from the variable capacitance element, a first sample and hold circuit that samples and holds the output voltage outputted from the integration circuit, and a second sample and hold circuit that samples and holds the output voltage sampled and held by the first sample and hold circuit. The second sample and hold circuit performs a simultaneous sampling operation in synchronism with the first sample and hold circuit during an initial sampling period. Moreover, the second sample and hold circuit performs a subsequent sampling operation at a rear-end period in a sampling period of the first sample and hold circuit other than the sampling period at which the simultaneous sampling operation is performed.

In the disclosed capacitance-to-voltage conversion circuit, the second sample and hold circuit performs the simultaneous sampling operation in synchronism with the first sample and hold circuit at the same period as at least an initial sampling period of the first sample and hold circuit. By the simultaneous sampling operation, the second sample and hold circuit samples and holds the output voltage from the integration circuit, which is sampled and held by the first sample and hold circuit. This allows electric charges to be accumulated in the second sample and hold circuit. The second sample and hold circuit performs a sampling operation in the rear-end period of the sampling period of the first sample and hold circuit other than the sampling period at which the simultaneous sampling operation is performed.

In the capacitance-to-voltage conversion circuit, when the first and the second sample and hold circuits connect with the output terminal of the integration circuit, the load capacity increases and the bandwidth narrows, with the result that high-order device noises decrease that are contained in the positive-phase output signal and negative-phase output signal output to the subsequent circuit. If, with the second sample and hold circuit being in connection, the first sample and hold circuit samples and holds the output voltages from the integration circuit, electric charges need to be accumulated not only in the first sample and hold circuit but also in the second sample and hold circuit. Consequently, even though the high-order device noises are reduced as a result of the band limitation, there is a need to increase the time taken to accumulate desired electric charges in the first and second sample and hold circuits, i.e., the processing time of the capacitance-to-voltage conversion required to sample the output voltages from the integration circuit, whereupon the operation speed may not be secured.

In contrast to this, the above capacitance-to-voltage conversion circuit carries out the sample and hold by allowing the second sample and hold circuit, which accumulated electric charges is in advance, to connect to the first sample and hold circuit only during the rear-end period of the sampling period of the first sample and hold circuit. Thus, according to the capacitance-to-voltage conversion circuit, the power consumption can be reduced by keeping the process time for capacitance-to-voltage conversion, and simultaneously the high-order noises can be reduced to achieve a noise reduction.

In the capacitance-to-voltage conversion circuit disclosed herein, the first sample and hold circuit may include a first capacitance element that holds the output voltage, a first switch that connects the first capacitance element to the integration circuit to sample the output voltage. The second sample and hold circuit may include a second capacitance element that holds the output voltage, and a second switch that connects the second capacitance element to the first capacitance element to sample the output voltage.

In the first sample and hold circuit of the above capacitance-to-voltage conversion circuit, the first switch connects the first capacitance element holding the output voltage to the integration circuit. In the second sample and hold circuit, the second switch connects the second capacitance element holding the output voltage to the first capacitance element. In the capacitance-to-voltage conversion circuit, the first switch is turned on to subject the first sample and hold circuit to the sampling operation. The first and second switches are turned on to perform the simultaneous sampling operation and subject the first and second sample and hold circuits to sampling operations at the rear-end period in the sampling period of the first sample and hold circuit.

In the capacitance-to-voltage conversion circuit disclosed herein, the variable capacitance element may include first and second variable capacitance elements having one ends connected as a common terminal to each other and other ends alternately supplied with voltages complementary with respect to a reference voltage. Moreover, the integration circuit may include a differential amplifier having a positive-phase output terminal and a negative-phase output terminal that output differential output voltages depending on a difference in electric charge supplied to the common terminal via the first variable capacitance elements and electric charge supplied to the common terminal via the second variable capacitance elements. The first capacitance element may include a positive-phase capacitance element and a negative-phase capacitance element that sample and hold each of the differential output voltages. The first switch may include a third switch and a fourth switch. The third switch connects the positive-phase output terminal of the differential amplifier to the positive-phase capacitance element, and connects the negative-phase output terminal of the differential amplifier to the negative-phase capacitance element. The fourth switch connects the positive-phase output terminal of the differential amplifier to the negative-phase capacitance element, and connects the negative-phase output terminal of the differential amplifier to the positive-phase capacitance element.

In addition, the second switch may connect the positive-phase and negative-phase capacitance elements to the respective terminals of the second capacitance element. The capacitance-to-voltage conversion circuit may turn on the third switch or the fourth switch depending on the direction of application of the complementary voltages.

The above capacitance-to-voltage conversion circuit provides a correlated double sampling (CDS) circuit in which electric charges are inputted to the differential amplifier from the common terminal of the first and second variable capacitance elements alternately to which complementary voltages are supplied, and in which differential output voltages outputted from the positive-phase and negative-phase output terminals of the differential amplifier are sampled and held by the first and second sample and hold circuits. This enables the noises to be more reduced.

In the capacitance-to-voltage conversion circuit according to the technique disclosed in the present application, the simultaneous sampling operation may be performed in a plurality of sampling periods consecutive from the initial sampling period.

In the above capacitance-to-voltage conversion circuit, the simultaneous sampling operation accumulating electric charges in advance is performed in a plurality of sampling periods consecutive from the initial sampling period of the first sample and hold circuit. According to this capacitance-to-voltage conversion circuit, the number of consecutive sampling periods to perform the simultaneous sampling operation can be adjusted depending on the charge amount required to be in advance accumulated in the second sample and hold circuit.

In the capacitance-to-voltage conversion circuit disclosed herein, the integration circuit may output an output current that increases in the simultaneous sampling operation.

In the above capacitance-to-voltage conversion circuit, during performing the simultaneous sampling operation, there is performed, for example, a control to temporarily enhance the drive capacity of the differential amplifier included in the integration circuit, to increase the output current. This enables the processing time for accumulating electric charges in advance in the second sample and hold circuit to be shortened.

According to the circuit disclosed herein, noise reduction can be reduced while also reducing the power consumption with processing time for capacitance-to-voltage conversion maintained.

DETAILED DESCRIPTION OF THE EMBODIMENTS

Figure 1:
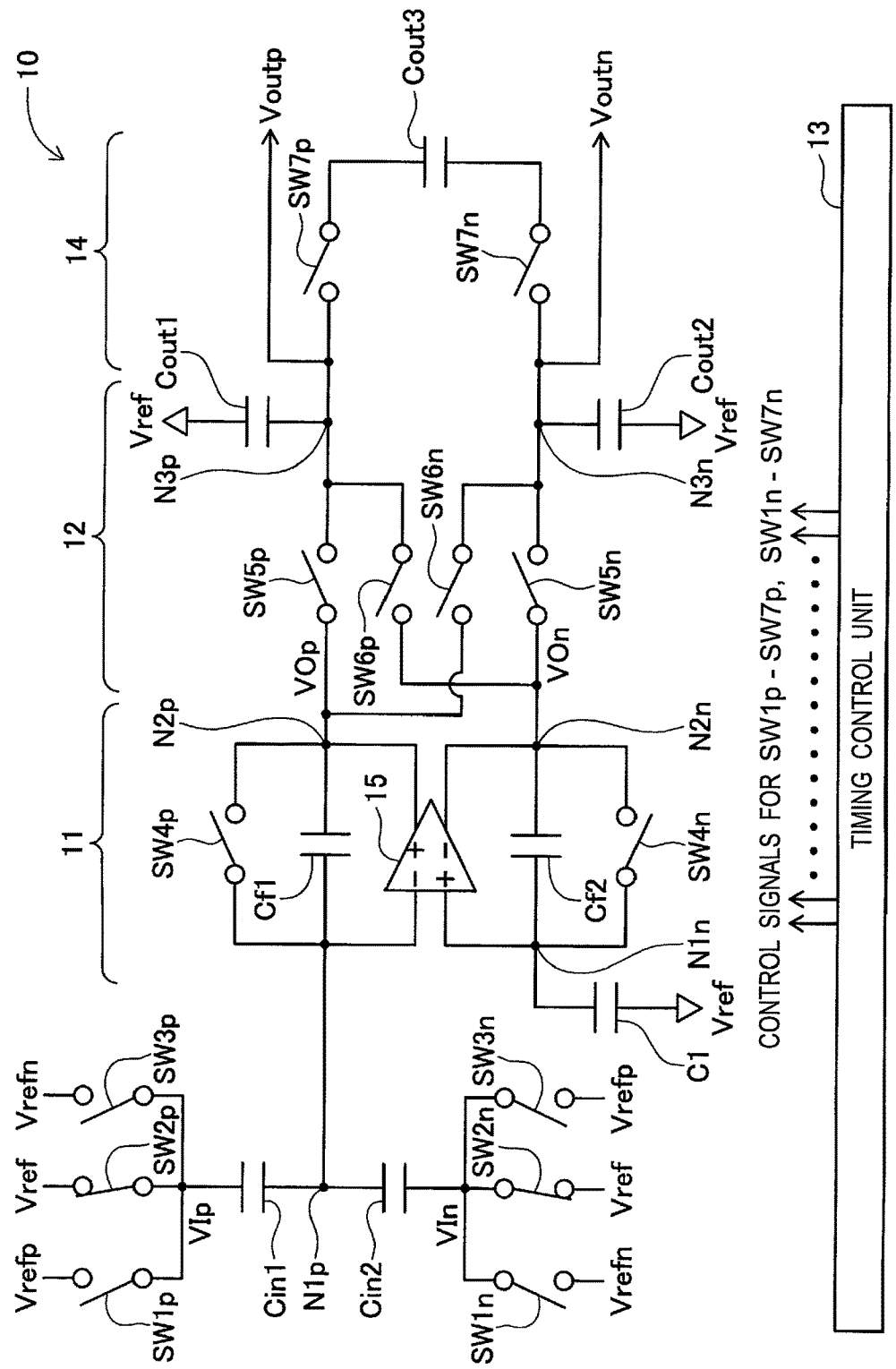
FIG. 1 is a circuit diagram showing a configuration of a capacitance-to-voltage (CV) conversion circuit of the embodiment.

The present disclosure will now be described with reference to the accompanying drawings. FIG. 1 shows a configuration of a capacitance-to-voltage (CV) conversion circuit of the exemplary embodiment. A capacitance-to-voltage conversion circuit 10 shown in FIG. 1 is applicable to a capacitive acceleration sensor, for example. The capacitance-to-voltage conversion circuit 10 includes first and second variable capacitance elements Cin1, Cin2, an integration circuit 11, a first sample and hold circuit 12, a timing control unit 13, and a second sample and hold circuit 14. The capacitance-to-voltage conversion circuit 10 is a circuit that outputs a positive-phase output signal Voutp and a negative-phase output signal Voutn representing a voltage value corresponding to the capacitance of the first and second variable capacitance elements Cin1, Cin2, which varies depending on the acceleration.

Each of the first and second variable capacitance elements Cin1, Cin2 has one electrode connected to a node N1p, acting as a common terminal. Switches SW1p, SW2p, SW3p are connected to the other electrode of the first variable capacitance element Cin1, which is different from the electrode connected to the node N1p. When any one of the switches SW1p, SW2p, SW3p is turned on, any one of a positive reference voltage Vrefp, a reference voltage Vref, and a negative reference voltage Vrefn is supplied to the first variable capacitance element Cin1. Switches SW1n, SW2n, SW3n are connected to the other electrode of the second variable capacitance element Cin2, which is different from the electrode connected to the node N1p. When any one of the switches is turned on, any one of the positive reference voltage Vrefp, the reference voltage Vref, and the negative reference voltage Vrefn is supplied to the second variable capacitance element Cin2.

According to the exemplary embodiment, the timing control unit 13 controls on/off of the switches SW1p to SW3p and the switches SW1n to SW3n by control signals, to supply a positive-phase input signal VIp and a negative-phase input signal VIn to the first and second variable capacitance elements Cin1, Cin2, respectively. The positive-phase input signal VIp and the negative-phase input signal VIn are complementary to the reference voltage.

The integration circuit 11 is a circuit that integrates electric charges supplied to the node N1p via the first and second variable capacitance elements Cin1, Cin2, to output a positive-phase output voltage VOp and a negative-phase output voltage VOn, indicative of integration results. The integration circuit 11 has a differential amplifier 15, feedback capacitance elements Cf1, Cf2, and switches SW4p, SW4n each connected in parallel to the feedback capacitance element Cf1 or Cf2.

The node N1p is connected to an inverting input terminal (negative input terminal) of the differential amplifier 15. The feedback capacitance element Cf1 is connected between the inverting input terminal and a non-inverting output terminal (positive output terminal) of the differential amplifier 15. The feedback capacitance element Cf2 is connected between a non-inverting input terminal (positive input terminal) and an inverting output terminal (negative output terminal) of the differential amplifier 15. A node N1n is connected to the non-inverting input terminal of the differential amplifier 15. The reference voltage Vref is applied via a capacitance element C1 to the node N1n. The non-inverting output terminal of the differential amplifier 15 is connected to a node N2p outputting the positive-phase output voltage VOp. The inverting output terminal of the differential amplifier 15 is connected to a node N2n outputting the negative-phase output voltage VOn.

The first sample and hold circuit 12 is connected subsequent to the integration circuit 11. The first sample and hold circuit 12 has switches SW5p, SW5n, switches SW6p, SW6n, a positive-phase capacitance element Cout1, and a negative-phase capacitance element Cout2. The switch SW5p is connected between the node N2p and a node N3p to which one electrode of the positive-phase capacitance element Cout1 is connected. The switch SW5n is connected between the node N2n and a node N3n to which one electrode of the negative-phase capacitance element Cout2 is connected. The switch SW6p is connected between the node N2n and the node N3p. The switch SW6n is connected between the node N2p and the node N3n. The positive-phase capacitance element Cout1 has the one electrode connected to the node N3p and the other electrode to which the reference voltage Vref is applied. The negative-phase capacitance element Cout2 has the one electrode connected to the node N3n and the other electrode to which the reference voltage Vref is applied.

As further shown, the second sample and hold circuit 14 is connected subsequent to the first sample and hold circuit 12. In operation, the second sample and hold circuit 14 samples and holds the positive-phase output voltage VOp and the negative-phase output voltage VOn which are sampled and held by the first sample and hold circuit 12. The second sample and hold circuit 14 has second switches SW7p, SW7n and a second capacitance element Cout3. The second switch SW7p is connected between the node N3p and one electrode of the second capacitance element Cout3. The second switch SW7n is connected between the node N3n and the other electrode of the second capacitance element Cout3. The second switch SW7p is not connected to the other electrode of the two electrodes of the second capacitance element Cout3. Therefore, the second capacitance element Cout3 is connected between the second switch SW7p and the second switch SW7n.

Moreover, according to one embodiment, the node N3p is connected to a subsequent circuit (e.g., analog-to-digital conversion circuit (not shown)), to output the positive-phase output signal Voutp to the subsequent circuit. The node N3n is connected to a subsequent circuit (e.g., analog-to-digital conversion circuit), to output the negative-phase output signal Voutn to the subsequent circuit. The value of capacitance of the second capacitance element Cout3 may be set as same as that of the positive-phase capacitance element Cout1 and the negative-phase capacitance element Cout2, so that the relative accuracy between the capacitance elements can be improved.

In the exemplary embodiment, the timing control unit 13 controls on/off of the switches SW1p to SW3p and the switches SW1n to SW3n to generate the positive-phase input signal VIp and the negative-phase input signal VIn. Further, the timing control unit 13 performs on/off control of the other switches SW4p to SW7p and the switches SW4n to SW7n.

Figure 2:
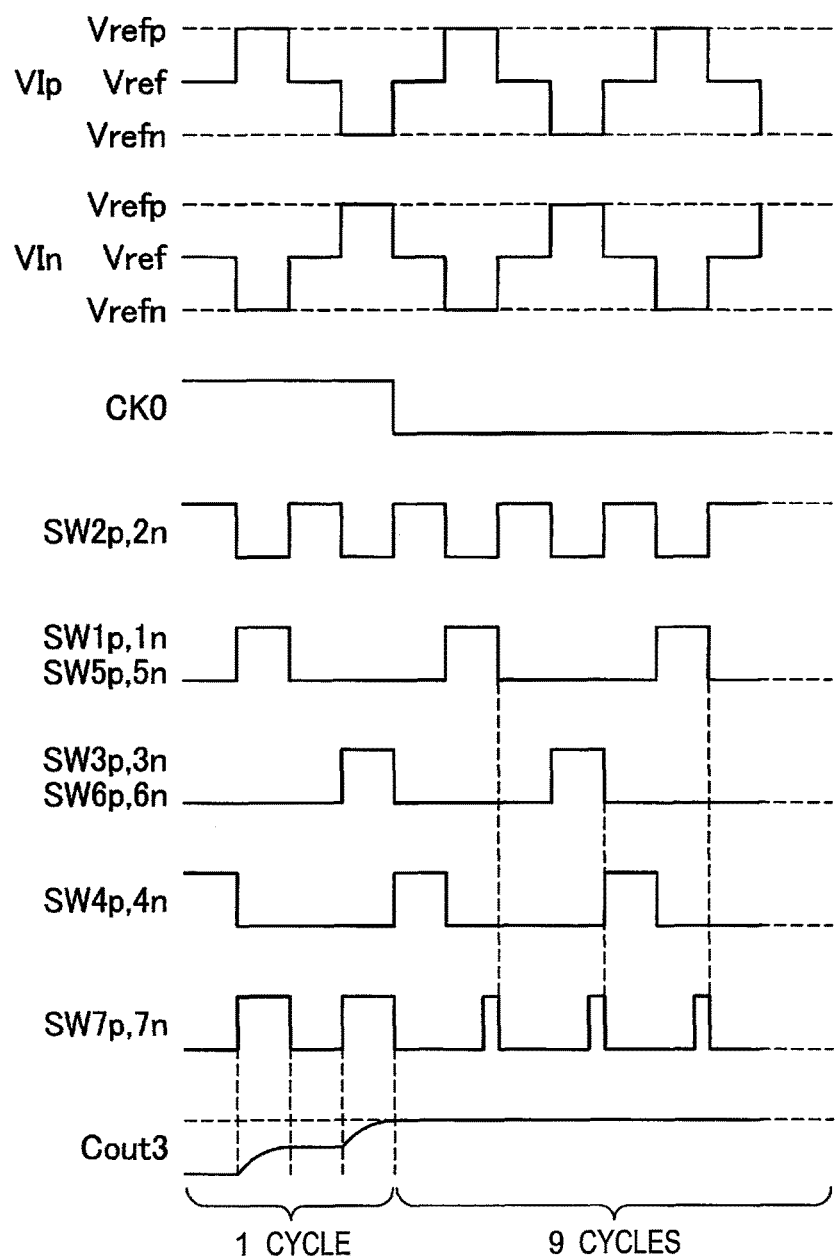
FIG. 2 is a time chart showing examples of sampling and holding operations of the capacitance-to-voltage conversion circuit.

FIG. 2 is a timing chart showing operations of the capacitance-to-voltage conversion circuit 10 according to the exemplary embodiment. The timing control unit 13 drives the switches SW1p to SW3p and SW1n to SW3n, as shown in FIG. 2, to cause the positive-phase input signal VIp and negative-phase input signal VIn to be complementary rectangular waveforms swinging from the reference voltage Vref to the positive side by the reference voltage Vrefp and to the negative side by the reference voltage Vrefn, respectively. The positive-phase input signal VIp is supplied to the first variable capacitance element Cin1 and the negative-phase input signal VIn is supplied to the second variable capacitance element Cin2, respectively. The timing control unit 13 turns on the switch SW4p to connect between the node N1p and the node N2p, and simultaneously turns on the switch SW4n to connect between the node N1n and the node N2n.

Simultaneously with turning on of the switches SW4p and SW4n, the timing control unit 13 turns on the switches SW2p, SW2n to supply the positive-phase input signal VIp having the reference voltage Vref to the first variable capacitance element Cin1 and supply the negative-phase input signal VIn having the reference voltage Vref to the second variable capacitance element Cin2. Accordingly, the inverting input terminal and the non-inverting input terminal of the differential amplifier 15 are initialized to the reference voltage Vref (hereinafter, referred to as "first initialization"). At that time, in the absence of physical quantities such as acceleration, the voltages across the first and second variable capacitance elements Cin1, Cin2 result in the reference voltage Vref and electric charges accumulated in the first and second variable capacitance elements Cin1, Cin2 become zero. The timing control unit 13 turns off the switches SW2p, SW2n and the switches SW4p, SW4n to terminate the first initialization.

After the above first initialization, the switches SW5p, SW5n perform sampling and holding and then the switches SW6p, SW6n perform sampling and holding as shown in FIG. 2. In the capacitance-to-voltage conversion circuit 10, for example, the capacitance of each of the first and the second variable capacitance elements Cin1, Cin2 varies depending on the acceleration when the positive-phase input signal VIp and the negative-phase input signal VIn is supplied. For example, when no acceleration is applied, there is no variation in the capacitance of the first and second variable capacitance elements Cin1, Cin2 in the capacitance-to-voltage conversion circuit 10. Therefore, the following description will be given of operations, as an example, of the case that the capacitance of the first variable capacitance element Cin1 decreases while the capacitance of the second variable capacitance element Cin2 relatively increases. In this case, the decrease in the capacitance of the first variable capacitance element Cin1 is represented as $-\Delta C$ and the increase in the capacitance of the second variable capacitance element Cin2 is represented as $\Delta C$.

For example, when the switches SW1p, SW1n are turned on by the timing control unit 13, electric charges accumulated in the first variable capacitance element Cin1 vary by $\Delta Q1=-\Delta C$ (Vrefp−Vref), as compared with the state when no acceleration is applied. Electric charges accumulated in the second variable capacitance element Cin2 vary by $\Delta Q2=\Delta C$ (Vrefn−Vref), as compared with the state when no acceleration is applied. As a result, the amount of variation of electric charges accumulated in the first and second variable capacitance element Cin1, Cin2, caused by the variation in the capacitance, is induced at the node N1p as a negative difference charge $-\Delta Q$ that equals to the sum of $\Delta Q1$ and $\Delta Q2$. The integration circuit 11 changes the positive-phase output voltage VOp and the negative-phase output voltage VOn in accordance with the negative amount of change (difference charge $-\Delta Q$) inputted to the inverting input terminal of the differential amplifier 15. The differential amplifier 15 changes the positive-phase output voltage VOp so that the negative difference charge $-\Delta Q$ induced at the node N1p is accumulated in the feedback capacitance element Cf1 or is pulled out from the feedback capacitance element Cf1. At the same time, the negative-phase output voltage VOn is changed so that the node N1n maintains the state of virtual ground with the node N1p, so that electric charges are charged to or discharged from the feedback capacitance element Cf2.

Under such condition, the differential amplifier 15 outputs a high positive-phase output voltage VOp when switches SW1p, SW1n are turned on by the timing control unit 13, and outputs a low positive-phase output voltage VOp when switches SW3p, SW3n are turned on. In other words, the differential amplifier 15 outputs the positive-phase output voltage VOp so as to change polarity from the reference voltage Vref to the positive side and to the negative side in accordance with the amount of change in the capacitance of the first and second variable capacitance elements Cin1, Cin2 and the voltage level of the reference voltages Vrefp, Vrefn applied thereto. Similarly, the differential amplifier 15 outputs a low negative-phase output voltage VOn when switches SW1p, SW1n are turned on by the timing control unit 13, and outputs a high negative-phase output voltage VOn when switches SW3p, SW3n are turned on.

In the capacitance-to-voltage conversion circuit 10, as described above, based on the negative difference charge $-\Delta Q$ induced at the node N1p as the connection point between the first and second variable capacitance elements Cin1, Cin2 receiving complementary voltage signals (positive-phase input signal VIp and the negative-phase VIn) whose voltage levels alternate with respect to the reference voltage, the differential amplifier 15 outputs difference voltages (positive-phase output voltage VOp and negative-phase output voltage VOn) corresponding to the difference charge $-\Delta Q$.

The timing control unit 13 turns on the switches SW5p, SW5n and turns off the switches SW6p, SW6n at a sampling period during which the positive-phase input signal VIp is at the positive reference voltage Vrefp and the negative-phase input signal VIn is at the negative reference voltage Vrefn. The timing control unit 13 turns off the switches SW5p, SW5n and turns on the switches SW6p, SW6n at a sampling period during which the positive-phase input signal VIp is at the negative reference voltage Vrefn and the negative-phase input signal VIn is at the positive reference voltage Vrefp. As a result, when the capacitance of the first variable capacitance element Cin1 decreases and the capacitance of the second variable capacitance element Cin2 increases as described above, a high positive-phase output voltage VOp and a high negative-phase output voltage VOn are alternately sampled and held in the positive-phase capacitance element Cout1. At that time, a low positive-phase output voltage VOp and a low negative-phase output voltage VOn are alternately sampled and held in the negative-phase capacitance element Cout2.

In accordance with the sample-and-hold timing of the first sample and hold circuit 12, the timing control unit 13 turns on the second switches SW7p, SW7n of the second sample and hold circuit 14, to connect the nodes N3p, N3n to opposite ends, respectively, of the second capacitance element Cout3. The details of the operation of the second sample and hold circuit 14 will be described later. At any timing after second initialization described later, the capacitance-to-voltage conversion circuit 10 outputs voltages sampled and held in the positive-phase capacitance element Cout1 and the negative-phase capacitance element Cout2, as the positive-phase output signal Voutp and the negative-phase output signal Voutn, from the nodes N3p, N3n to the subsequent circuit (e.g., analog-to-digital conversion circuit). In this manner, the positive-phase output signal Voutp and the negative-phase output signal Voutn corresponding to the difference charge $-\Delta Q$ of the first and second variable capacitance elements Cin1, Cin2 are outputted from the nodes N3p, N3n to the subsequent circuit.

The operations performed when the capacitance of the first variable capacitance element Cin1 increases and the capacitance of the second variable capacitance element Cin2 decreases will not again be described herein since they are similar to those of the above case except that the positive and negative polarities of the positive-phase output voltage VOp, the negative-phase output voltage VOn and the like with respect to the reference voltage Vref differ therefrom. As will be described later, the timing to turn on the second switches SW7p, SW7n is at a period limited to a rear-end period of the sampling period of the first sample and hold circuit 12 (this "sampling period" will be described below).

Figure 3:
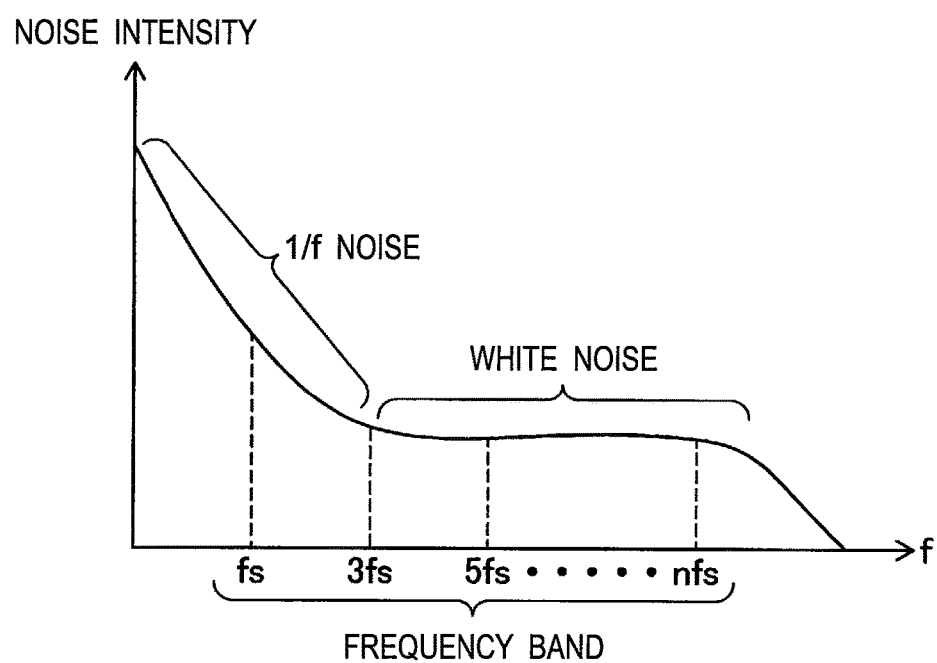
FIG. 3 is a graph representing the relationship between a sampling frequency and a device noise.

The above capacitance-to-voltage conversion circuit 10 is subjected to a device noise from various devices, such as semiconductor devices and resistive elements, disposed on the circuit. The device noise is for example a white noise or a 1/f noise. FIG. 3 shows an example of the device noise contained in the positive-phase output signal Voutp and the negative-phase output signal Voutn of the capacitance-to-voltage conversion circuit 10. As shown in FIG. 3, for example, the white noise occurring in the capacitance-to-voltage conversion circuit 10 has a uniform noise intensity within a frequency band operable by the differential amplifier 15 without depending on a specific frequency. The white noise is generated by, for example, an electronic thermal vibration in the resistive element. The 1/f noise is proportional to the reciprocal of the frequency and has an increased noise intensity in a low frequency band. The 1/f noise is generated by, for example, gate oxide film trapped charges occurring from MOS transistor gate oxide film pollution or crystal defects, the trapped charges supplementing or releasing carriers at random to cause fluctuations in the number of carriers.

The above device noises undergo noise returns as a result of superimposed processing of noises such as a sampling frequency noise with the sample-and-hold operation as well as a high-order frequency noise which can be sampled at a half frequency of the sampling frequency (Nyquist frequency). For example, assume as shown in FIG. 3 that the device noises include device noises of high-order frequencies (3-times frequency 3fs, 5-times frequency 5fs, ... n-times frequency nfs) that are odd multiples of the sampling frequency. These device noises are added in a piled-up manner to the capacitance-to-voltage-converted voltages sampled and held in the positive-phase and negative-phase capacitance elements Cout1, Cout2. The device noises contained in the voltages sampled and held in the positive-phase and negative-phase capacitance elements Cout1, Cout2 are to be outputted to the subsequent circuit (such as the analog-to-digital conversion circuit) while remaining contained in the positive-phase output signal Voutp and the negative-phase output signal Voutn. As a result, the positive-phase output signal Voutp and the negative-phase output signal Voutn have worsened signal-to-noise ratios and are incorrectly processed in the subsequent circuit.

To solve the above problem, the capacitance-to-voltage conversion circuit 10 of this embodiment includes the second capacitance element Cout3 between the second switch SW7p and the second switch SW7n, and the second switches SW7p and SW7n are turned on in synchronism with the sampling frequency of the first sample and hold circuit 12 so that the second capacitance element Cout3 is connected to the positive-phase and negative-phase capacitance elements Cout1, Cout2 to narrow the bandwidth, thereby achieving a reduction of noise.

In the operation examples shown in FIG. 2, the positive-phase input signal VIp supplied to the first variable capacitance element Cin1 and the negative-phase input signal VIn supplied to the second variable capacitance element Cin2 of the capacitance-to-voltage conversion circuit 10 have rectangular waveforms complementary with respect to the reference voltage Vref, and have a sequence where the voltage levels alternate via periods during which the reference voltage Vref is applied to both of the first and second variable capacitance elements Cin1, Cin2. In the sequence, the second switches SW7p, SW7n are turned on in synchronism with the periods during which complementary voltages are applied as the positive-phase input signal VIp and the negative-phase input signal VIn. In this case, one sampling period of the first sample and hold circuit 12 is a period corresponding to a half cycle of the positive-phase input signal VIp and the negative-phase input signal VIn, e.g., a period during which after achieving the reference voltage Vref, the positive-phase input signal VIp shifts to the positive reference voltage Vrefp and again returns to the reference voltage Vref (equivalently, a period during which after turning on the switch SW2p, the switch to be turned on is changed over to the switch SW1p and then the switch SW2p is again turned on).

In the case that one cycle is two sampling periods (one cycle of the positive-phase input signal VIp and the negative-phase input signal VIn), the timing control unit 13 repeatedly executes similar processing for each ten cycles for example. The timing control unit 13 is fed with a clock signal CK0 synchronized every tenth cycle. The clock signal CK0 is a synchronization signal that goes high in one cycle (2 sampling periods) but goes low in remaining nine cycles (18 sampling periods). A leading one cycle of each ten cycles as a repeating unit is set to a second initialization cycle, in which the clock signal CK0 goes high.

In the second initialization cycle, the timing control unit 13 allows the second capacitance element Cout3 of the second sample and hold circuit 14 to accumulate electric charges. That is, in the second initialization cycle, the second sample and hold circuit 14, in advance, accumulates the electric charges in the second capacitance element Cout3 by performing sampling (hereinafter, may be referred to as "simultaneous sampling operation") synchronized with two consecutive sampling periods of the first sample and hold circuit 12. The purpose of charging the second capacitance element Cout3 disposed for the band limitation at the time of the second initialization is for keeping the voltage value held in the second capacitance element Cout3 to be substantially equal to the sum of the voltage values held in the positive-phase and negative-phase capacitance elements Cout1, Cout2 when connecting the second capacitance element Cout3 to the nodes N3p, N3n in the remaining nine cycles.

If there exists a voltage difference between both, a movement of electric charges may occur, with the result that the voltages output as the positive-phase and negative-phase output signals Voutp, Voutn may vary transiently. Further, since the movement of electric charges between both is irrelevant to the positive-phase and negative-phase output voltages VOp, VOn output from the integration circuit 11, the voltage value derived from the movement of electric charges may deviate from the proper voltage value. Furthermore, it may take a lot of time for the deviated voltage value to converge to the proper value.

To provide further detail, in one cycle (second initialization) in which the clock signal CK0 goes high, the timing control unit 13 charges the positive-phase and negative-phase capacitance elements Cout1, Cout2 of the first sample and hold circuit 12 and charges the second capacitance element Cout3 of the second sample and hold circuit 14. That is, in an initial sampling period in which the positive-phase input signal VIp is at a positive reference voltage Vrefp and the negative-phase input signal VIn is at a negative reference voltage Vrefn, the switches SW5p, SW5n are turned on but the switches SW6p, SW6n are turned off, and simultaneously the second switches SW7p, SW7n are turned on.

In this embodiment, the potential difference across the second capacitance element Cout3 is twice the potential difference across the positive-phase capacitance element Cout1. The potential difference across the second capacitance element Cout3 is twice the potential difference across the negative-phase capacitance element Cout2. Assuming that all of the positive-phase capacitance element Cout1, the negative-phase capacitance element Cout2, and the second capacitance element Cout3 have the same capacitance value, the second capacitance element Cout3 is charged with electric charges that are twice the electric charges accumulated in each of the positive-phase and negative-phase capacitance elements Cout1, Cout2. Therefore, the capacitance elements Cout1 to Cout3 are charged with an output current (charge amount per unit time: the output current is assumed herein to be a constant value for simplicity of explanation) supplied from the integration circuit 11, so that a time interval taken for the positive-phase and negative-phase output voltages VOp, VOn outputted from the integration circuit 11 to achieve any potentials (potentials of the positive-phase and negative-phase output voltages VOp, VOn to be outputted as a result of the capacitance-to-voltage conversion), i.e., a time interval to charge the amount of charge to be accumulated in the positive-phase and negative-phase capacitance elements Cout1, Cout2 with the second capacitance element Cout3 connected, can be considered to be twice the time interval to charge the amount of charge to be accumulated in the positive-phase and negative-phase capacitance elements Cout1, Cout2 without the connection of the second capacitance element Cout 3.

With the connection of the positive-phase and negative-phase capacitance elements Cout1, Cout2, the second capacitance element Cout3 can be charged with half of a desired charge amount in the first sampling period and can be charged additionally with remaining half of the charge amount in the next sampling period. As used herein, the "desired charge amount" refers to the charge amount to be accumulated in the positive-phase and negative-phase capacitance elements Cout1, Cout2 without the connection of the second capacitance element Cout3. In one cycle in which the clock signal CK0 goes high, electric charges are gradually accumulated for each sampling period in the second capacitance element Cout3 (see FIG. 2), which is disconnected from the circuit due to the second switches SW7p, SW7n turned off after accumulation, allowing the accumulated electric charges to be held.

Next, in the remaining nine cycles in which the clock signal CK0 goes low, the timing control unit 13 turns on the second switches SW7p, SW7n in synchronism with the sampling periods. At this time, the timing control unit 13 turns on the second switches SW7p, SW7n in periods immediately before the positive-phase capacitance element Cout1 is held at high level and the negative-phase capacitance element Cout2 is held at low level, allowing the second capacitance element Cout3 to be connected to the positive-phase and negative-phase capacitance elements Cout1, Cout2. If the second sample and hold circuit 14 disposed for band limitation is configured to perform, at that time, sampling and holding simultaneously with that of the first sample and hold circuit 12 (if it is configured to perform simultaneous sampling operations at that time), not only the positive-phase and negative-phase capacitance elements Cout1, Cout2 but also the second capacitance element Cout3 needs to be charged, resulting in a reduction of electric charges accumulated in each of the capacitance elements Cout1 to Cout3. In this case, there is concern that the final voltage values of the positive-phase and negative-phase capacitance elements Cout1, Cout2 after the elapse of the sampling periods may not converge to the desired voltage values.

In order to prevent the above deficiency, the on-time of the second switches SW7p, SW7n is shortened in this embodiment. As used herein, the desired voltage value refers to, for example, a voltage value at which the differences between target voltage values of the positive-phase and negative-phase output signals Voutp, Voutn and the above-described "final voltage values" become equal to or less than a minimum input voltage fluctuation (resolution) distinguishable by the analog-to-digital conversion circuit subsequent to the capacitance-to-voltage conversion circuit 10.

The timing control unit 13 then turns on the switches SW1p, SW1n and the switches SW5p, SW5n, allowing sufficient electric charges to be accumulated in the positive-phase and negative-phase capacitance elements Cout1, Cout2. In this state, the second capacitance element Cout3 having previously accumulated electric charges is connected to the positive-phase and negative-phase capacitance elements Cout1, Cout2 in the rear-end period of the sampling period. In accordance with this, the load capacity is increased to narrow the bandwidth of the differential amplifier 15.

In the capacitance-to-voltage conversion circuit 10, the timing control unit 13 turns off the switches SW5p, SW5n and the second switches SW7p, SW7n so that a positive-phase output signal Voutp and a negative-phase output signal Voutn having reduced device noises are held in the positive-phase capacitance element Cout1 and the negative-phase capacitance element Cout2, respectively. At some timing during nine cycles in which the clock signal CK0 goes low, the capacitance-to-voltage conversion circuit 10 outputs voltages sampled and held in the positive-phase capacitance element Cout1 and the negative-phase capacitance element Cout2, as the positive-phase output signal Voutp and the negative-phase output signal Voutn, from the nodes N3p, N3n to the subsequent circuit.

Similarly, in the rear-end period of the sampling period after achieving the state where sufficient electric charges are accumulated in the positive-phase and negative-phase capacitance elements Cout1, Cout2 with the switches SW3p, SW3n and the switches SW6p, SW6n turning on, the second capacitance element Cout3 having previously accumulated electric charges is connected to the positive-phase and negative-phase capacitance elements Cout1, Cout2, to thereby narrow the bandwidth.

Considering that the above-described capacitance-to-voltage conversion circuit 10 is implemented in a capacitive acceleration sensor, it is typical that the bandwidth of a signal generated by application of acceleration to the acceleration sensor is, for example, several kHz whereas the sampling frequency of sample and hold is, for example, several hundred kHz. Therefore, even if a cycle to charge (second initialization) the second capacitance element Cout3 is set only once in 10 cycles for example, it is possible to ensure the number of cycles, in the remaining cycles after charging, enough for the first sample and hold circuit 12 to sample and hold the positive-phase output voltage VOp and the negative-phase output voltage VOn outputted from the differential amplifier 15.

In one cycle in which the clock signal CK0 goes high, voltages sampled and held in the positive-phase and negative-phase capacitance elements Count1, Cout2 might not result in correct values due to the connection of the second capacitance element Cout3 having insufficiency accumulated electric charges. As a means to this problem, it can be processed to discard the positive-phase output signal Voutp and negative-phase output signal Voutn of this one cycle. For example, between the nodes N3p, N3n and a subsequent circuit (e.g., the analog-to-digital conversion circuit), the capacitance-to-voltage conversion circuit 10 may have a switch for stopping output of the positive-phase output signal and negative-phase output signal for one cycle in which the clock signal CK0 goes high, to the subsequent stage. Alternatively, a circuit subsequent to the capacitance-to-voltage conversion circuit 10 may be set to discard the positive-phase output signal and negative-phase output signal of one cycle in which the clock signal CK0 goes high.

According to the above embodiment, the following effects are achieved.

<Effect 1> The timing control unit 13 executes processing for each ten cycles as a repeating unit whose one cycle is set to one cycle of the positive-phase input signal VIp and the negative-phase input signal VIn. This one cycle corresponds to two sampling periods of the first sample and hold circuit 12. In an initial one cycle, the second sample and hold circuit 14 performs a simultaneous sampling operation in synchronism with the two consecutive sampling periods of the first sample and hold circuit 12. By the simultaneous sampling operation, the second sample and hold circuit 14 samples and holds the positive-phase output voltage VOp and negative-phase output voltage VOn which is, at the same time, sampled and held by the first sample and hold circuit 12 from the integration circuit 11.

As a result, some electric charges are accumulated beforehand in the second capacitance element Cout3 of the second sample and hold circuit 14. In the remaining nine cycles, the second sample and hold circuit 14 turns on the second switches SW7p, SW7n immediately before the positive-phase capacitance element Cout1 is held high and the negative-phase capacitance element Cout2 is held low, allowing the second capacitance element Cout3 to be connected to the positive-phase and negative-phase capacitance elements Cout1, Cout2. In the capacitance-to-voltage conversion circuit 10, when the first and the second sample and hold circuits 12, 14 (the positive-phase and negative-phase capacitance elements Cout1, Cout2, the second capacitance element Cout3) are connected to the output terminal of the integration circuit 11, the load capacity increases and the bandwidth narrows.

As a result, decrease of high-order device noises contained in the positive-phase output signal Voutp and negative-phase output signal Voutn to be outputted to the subsequent circuit is achieved. If, with the second sample and hold circuit 14 being in connection, the first sample and hold circuit 12 samples and holds the positive-phase output voltage VOp and negative-phase output voltage VOn from the integration circuit 11, electric charges need to be accumulated not only in the positive-phase and negative-phase capacitance elements Cout1, Cout2 but also in the second capacitance element Ccout3. Consequently, even though the high-order device noises are reduced as a result of the band limitation, there is a need to increase the time taken to accumulate desired electric charges in the first and second sample and hold circuits 12, 14, i.e., the processing time of the capacitance-to-voltage conversion required to sample the positive-phase output voltage VOp and negative-phase output voltage VOn outputted from the integration circuit 11, whereupon the operation speed could not be secured.

In contrast to this, the capacitance-to-voltage conversion circuit 10 of this embodiment carries out the sample and hold by allowing the second capacitance element Cout3, which is accumulated electric charges beforehand, to connect to the positive-phase and negative-phase capacitance elements Cout1, Cout2 only during the rear-end period of the sampling period immediately before the timing at which the positive-phase output voltage VOp and the negative-phase output voltage VOn are sampled and held in the positive-phase and negative-phase capacitance elements Cout1, Cout2 (timing to turn off SW5p, SW5n or SW6p, SW6n). Thus, according to the capacitance-to-voltage conversion circuit 10, the power consumption can be reduced by keeping the process time for capacitance-to-voltage conversion, and simultaneously the high-order noises can be reduced to achieve a noise reduction.

<Effect 2> In the capacitance-to-voltage conversion circuit 10, a negative difference charge −ΔQ for example is inputted to the differential amplifier 15 from the node N1p as the connection point between the first and second variable capacitance elements Cin1, Cin2 receiving complementary voltage signals (the positive-phase input signal VIp and the negative-phase input signal VIn) whose voltage levels alternate with respect to the reference voltage, and the differential amplifier 15 outputs the positive-phase output voltage VOp and the negative-phase output voltage VOn. The capacitance-to-voltage conversion circuit 10 provides a correlated double sampling (CDS) circuit which samples and holds the outputted positive-phase output voltage VOp and negative-phase output voltage VOn, so that a noise reduction can be achieved.

<Effect 3> The simultaneous sampling operation, in which electric charges are beforehand accumulated in the second capacitance element Cout3 of the second sample and hold circuit 14, is performed in an initial one cycle, i.e. two consecutive sampling periods. According to this capacitance-to-voltage conversion circuit 10, the number of consecutive sampling periods to perform the simultaneous sampling operation can be adjusted depending on the charge amount required to be beforehand accumulated in the second capacitance element Cout3.

The present invention is not intended to be limited to the above embodiment and could be variously improved or modified without departing from the spirit of the present invention.

For example, although in the above embodiment, only during one cycle of ten cycles the timing control unit 13 carries out the simultaneous sampling operation in which the second sample and hold circuit 14 is synchronized with the first sample and hold circuit 12 to pre-charge the second capacitance element Cout3, this is merely an example and is not limitative. For example, the timing control unit 13 may carry out the simultaneous sampling operation in which the second capacitance element Cout3 is pre-charged only during one cycle of 100 cycles, during ten cycles of 100 cycles, or during one sampling period that is half of one cycle.

Further, in one or plural cycles or one sampling period during which the simultaneous sampling operation to pre-charge the second capacitance element Cout3 is carried out, the timing control unit 13 may perform a control to temporarily enhance the drive capacity of the differential amplifier 15 to increase the output current. For example, the differential amplifier 15 may include a current mirror circuit so that the number of connection of a plurality of MOS transistors, to which gate terminals of the current mirror circuit are connected, can be changeable based on the control from the timing control unit 13. The timing control unit 13 may change the number of connection of the MOS transistors in the current mirror circuit so as to perform control to increase or decrease the output current of the differential amplifier 15. Accordingly, the processing time for pre-charging the second capacitance element Cout3 can be reduced.

Although in the above described embodiment, the capacitance-to-voltage conversion circuit 10 is configured to include two variable capacitance elements, i.e., the first and second variable capacitance elements Cin1, Cin2 receiving complementary voltage signals (the positive-phase input signal VIp and the negative-phase input signal VIn), a single or three or more variable capacitance elements may be included.

In the above description, each of the first variable capacitance element Cin1 and the second variable capacitance element Cin2 is an example of the variable capacitance element. Each of the positive-phase capacitance element Cout1 and the negative-phase capacitance element Cout2 is an example of the first capacitance element. Each of the switches SW5p, SW5n is an example of the third switch included in the first switch. Each of the switches SW6p, SW6n is an example of the fourth switch included in the first switch. The one cycle (two sampling periods) in which the clock signal CK0 goes high is an example of the initial sampling period. The nine cycles (18 sampling periods) in which the clock signal CK0 goes low are an example of a sampling period excluding the sampling period in which the simultaneous sampling is performed. Each of the positive-phase output voltage VOp and the negative-phase output voltage VOn is an example of the differential output voltage (output voltage).

The invention claimed is:

1. A capacitance-to-voltage conversion circuit comprising:
    a variable capacitance element having a capacitance value that depends on a physical quantity applied to the variable capacitance element;
    an integration circuit that outputs a voltage by integrating electric charges generated by the variable capacitance element;
    a first sample and hold circuit that samples and holds the voltage output from the integration circuit; and
    a second sample and hold circuit that simultaneously samples and holds the voltage in synchronism with the first sample and hold circuit during at least an initial sampling period of the first sample and hold circuit,
    wherein the second sample and hold circuit further samples the voltage at a rear-end period in a subsequent sampling period of the first sample and hold circuit after the initial sampling period.

2. The capacitance-to-voltage conversion circuit according to claim 1, wherein the first sample and hold circuit comprises:
    a first capacitance element that holds the voltage; and
    a first switch that connects the first capacitance element to the integration circuit.

3. The capacitance-to-voltage conversion circuit according to claim 2, wherein the second sample and hold circuit comprises:
    a second capacitance element that holds the voltage; and
    a second switch that connects the second capacitance element to the first capacitance element.

4. The capacitance-to-voltage conversion circuit according to claim 3, wherein the variable capacitance element includes first and second variable capacitance elements having first ends connected at a common terminal to each other and respective second ends alternately coupled to voltages complementary with respect to a reference voltage.

5. The capacitance-to-voltage conversion circuit according to claim 4, wherein the integration circuit includes a differential amplifier having a positive-phase and negative-phase output terminals that output differential output voltages depending on a difference between electric charge supplied to the common terminal by the first and second variable capacitance elements.

6. The capacitance-to-voltage conversion circuit according to claim 5, wherein the integration circuit further includes:
    a pair of feedback capacitance elements coupled respective between the positive-phase and negative-phase output terminals and inputs of the differential amplifier; and
    a pair of switches connected in parallel to the pair of feedback capacitance elements, respectively.

7. The capacitance-to-voltage conversion circuit according to claim 5, wherein the first capacitance element includes a positive-phase capacitance element and a negative-phase capacitance element that sample and hold each of the differential output voltages.

8. The capacitance-to-voltage conversion circuit according to claim 7, wherein the first switch comprises:
    a third switch that connects the positive-phase output terminal of the differential amplifier to the positive-phase capacitance element and that connects the negative-phase output terminal of the differential amplifier to the negative-phase capacitance element; and
    a fourth switch that connects the positive-phase output terminal of the differential amplifier to the negative-phase capacitance element and that connects the negative-phase output terminal of the differential amplifier to the positive-phase capacitance element.

9. The capacitance-to-voltage conversion circuit according to claim 8, wherein the second switch comprises a pair of switches that connect the positive-phase and negative-phase capacitance elements to the respective terminals of the second capacitance element, respectively.

10. The capacitance-to-voltage conversion circuit according to claim 9, further comprising a timing control unit configured to turn on the third switch or the fourth switch depending on the direction of application of the complementary voltages.

11. The capacitance-to-voltage conversion circuit according to claim 1, wherein the second sample and hold circuit simultaneously samples and holds the voltage in a plurality of consecutive sampling periods subsequent to the initial sampling period.

12. The capacitance-to-voltage conversion circuit according to claim 1, wherein the integration circuit outputs an output current that increases when the second sample and hold circuit simultaneously samples and holds the voltage.

13. A capacitance-to-voltage conversion circuit comprising:
    first and second variable capacitance elements having first ends connected at a common terminal and respective second ends alternately coupled to voltages complementary with respect to a reference voltage;
    an integration circuit that includes a differential amplifier having an input coupled to the common terminal and positive-phase and negative-phase output terminals that output differential output voltages depending on a difference between electric charge supplied to the common terminal by the first and second variable capacitance elements;
    a first sample and hold circuit including a first capacitance element and a first switch that connects the first capacitance element to the integration circuit to sample the differential output voltages;
    a second sample and hold circuit including a second capacitance element and a second switch that connects the second capacitance element to the first capacitance element to sample the differential output voltages; and a timing control unit configured to control respective states of the first and second switches such that the second sample and hold circuit simultaneously samples and holds the differential output voltages in synchronism with the first sample and hold circuit during an initial sampling period and further samples the differential output voltages during a portion of a subsequent sampling period of the first sample and hold circuit.

14. The capacitance-to-voltage conversion circuit according to claim 13, wherein the portion of the subsequent sampling period is a rear-end period of a sampling period of the first sample and hold circuit after the initial sampling period.

15. The capacitance-to-voltage conversion circuit according to claim 13, wherein the integration circuit further includes:
    a pair of feedback capacitance elements coupled respective between the positive-phase and negative-phase output terminals and inputs of the differential amplifier; and
    a pair of switches connected in parallel to the pair of feedback capacitance elements, respectively.

16. The capacitance-to-voltage conversion circuit according to claim 13, wherein the first capacitance element of the first sample and hold circuit includes a positive-phase capacitance element and a negative-phase capacitance element that sample and hold each of the differential output voltages.

17. The capacitance-to-voltage conversion circuit according to claim 16, wherein the first switch of the first sample and hold circuit comprises:
    a third switch that connects the positive-phase output terminal of the differential amplifier to the positive-phase capacitance element and that connects the negative-phase output terminal of the differential amplifier to the negative-phase capacitance element; and
    a fourth switch that connects the positive-phase output terminal of the differential amplifier to the negative-phase capacitance element and that connects the negative-phase output terminal of the differential amplifier to the positive-phase capacitance element.

18. The capacitance-to-voltage conversion circuit according to claim 17, wherein the second switch of the second sample and hold circuit comprises a pair of switches that connect the positive-phase and negative-phase capacitance elements to the respective terminals of the second capacitance element, respectively.

19. The capacitance-to-voltage conversion circuit according to claim 13, wherein the second sample and hold circuit simultaneously samples and holds the differential output voltages in a plurality of consecutive sampling periods subsequent to the initial sampling period.

20. The capacitance-to-voltage conversion circuit according to claim 13, wherein the integration circuit outputs an output current that increases when the second sample and hold circuit simultaneously samples and holds the differential output voltages.

* * * * *